United States Patent [19]

Kompanek et al.

[11] Patent Number: 4,737,767
[45] Date of Patent: Apr. 12, 1988

[54] SOLID STATE KEYBOARD

[75] Inventors: Harry W. Kompanek; James R. Ligman, both of Santa Barbara, Calif.

[73] Assignee: KDC Corporation, Carpinteria, Calif.

[21] Appl. No.: 441,380

[22] Filed: Nov. 12, 1982

[51] Int. Cl.⁴ .............................................. G06F 3/02
[52] U.S. Cl. ............................ 340/365 A; 310/340; 310/345
[58] Field of Search ...................... 340/365 A, 365 R; 178/18; 310/311, 318, 319, 330, 339, 340, 345; 400/479; 200/5 A

[56] References Cited

U.S. PATENT DOCUMENTS

| | | | |
|---|---|---|---|
| 3,503,031 | 3/1970 | Nyhus | 340/365 A |
| 3,591,749 | 7/1971 | Comstock | 340/365 A |
| 3,732,389 | 5/1973 | Kaelin | 340/365 A |
| 3,935,485 | 1/1976 | Yoshida | 340/365 A |
| 4,190,785 | 2/1980 | Kompanek | 340/365 A |
| 4,194,083 | 3/1980 | Abe | 340/365 C |
| 4,234,813 | 11/1980 | Iguchi | 340/365 A |
| 4,296,406 | 10/1981 | Pearson | 340/365 A |
| 4,412,210 | 10/1983 | Washizuka | 340/365 R |
| 4,433,223 | 2/1984 | Larson | 200/5 A |

Primary Examiner—John W. Caldwell, Sr.
Assistant Examiner—Tyrone Queen
Attorney, Agent, or Firm—Ellsworth R. Roston; Charles H. Schwartz

[57] ABSTRACT

A housing, preferably electrically conductive, defines individual areas for depression to identify individual indicia, e.g., number, alphabetical letters. A hard, electrically insulating material attached to the housing transmits strains produced by the depression of the individual areas on the housing. A plurality of thin electrically insulating sheets are attached to the hard insulating material at the individual areas in the housing. A plurality of thin electrically conductive sheets attached to the thin insulating sheets. The insulating sheets and the conductive sheets may constitute printed circuit segments. A plurality of ceramic crystals are attached to individual ones of the conductive sheets. The electrically conductive sheets are preferably coupled electrically to the housing. This causes one surface of each crystal to be common to the adjacent area. When the keyboard is depressed in the adjacent keyboard area, each crystal becomes stressed and causes an electrical signal to be generated on the ungrounded surface of the crystal.

34 Claims, 2 Drawing Sheets

SOLID STATE KEYBOARD

This invention relates to keyboards and more particularly relates to keyboards for converting individual actuations of keys to electrical signals indicating the actuation of such keys. The invention especially relates to keyboards employing piezoelectric crystals to obtain the production of such electrical signals.

Keyboards are now in use for a wide variety of purposes. For example, keyboards have been included in typewriters for a considerable number of decades to provide documentary records of the information typed and are still in use for such purposes. Keyboards have also been used for the past several decades to provide messages for data processing purposes. For example, the messages typed on the keyboard represent data which are processed by data processing equipment to generate new or updated data.

The keyboards now in use generally have certain limitations. They generally include keys with movable parts. When the key is actuated, the parts are moved to provide an indication of the symbol represented by the key. These parts tend to become worn with continued use. When the parts become sufficiently worn, they operate inadequately and cause incorrect, or at least incomplete, information to be generated.

Another problem with keyboards now in use is that they require power supplies in order to convert mechanical forces to electrical signals. These power supplies tend to increase the size, cost and weight of the keyboards. Since these factors are important from psychological and competitive standpoints, the provision of a keyboard operative to generate electical signals without the use of a power supply would provide an important advantage from a competitive and psychological standpoint.

Since equipment employing keyboards is in widespread use, considerable effort and money have been expended in developing a keyboard which will operate without any mechanical parts and without any power supplies. Considerable effort and money have also been expended in providing a keyboard which is compact, sensitive and reliable. In spite of such efforts, the problems discussed above still exist in keyboards.

In application Ser. No. 417,524 filed by Harry Kompanek and Rickey H. Ming on Sept. 13, 1982, now abandoned, a keyboard was disclosed and claimed which eliminates the above disadvantages. The keyboard has no moving parts and requires no power supply. However, the keyboard is still able to generate a large and reliable electrical signal. Furthermore, the keyboard can be operated with a normal amount of pressure on the keys to generate such a large and reliable electrical signal.

In the keyboard disclosed and claimed in application Ser. No. 417,524, now abandoned, a housing is constructed to define individual areas for depression to identify individual indicia such as numbers or such as letters of the alphabet. A hard, electrically insulating material is attached to the housing to transmit strains produced in the housing by the depression of the individual areas on the housing. A plurality of thin sheets are provided with electrically insulating properties, each sheet being attached to the hard insulating material at positions corresponding to the individual areas in the housing. A plurality of thin sheets of an electrically conductive material are also provided, each attached to an associated one of the thin sheets having insulating properties. The insulating thin sheets and the conductive sheets may constitute printed circuits segments. A plurality of ceramic crystals are also included, each attached to an individual one of the electrically conductive sheets.

The electrically conductive sheets in application Ser. No. 417,524 now abandoned, are preferably coupled electrically to the housing, which may be made from an electrically conductive material. This causes one surface of each ceramic crystal to be common to the adjacent area. Each crystal becomes stressed when the keyboard is depressed in the adjacent area on the keyboard. When the crystal becomes stressed, it causes an electrical signal to be generated on the ungrounded surface of the crystal.

This invention provides a keyboard system with other advantages in addition to those obtained by the keyboard disclosed and claimed in application Ser. No. 417,524. In the system of this invention, an insulating layer overlaying the crystals is provided with a reduced durometer relative to the insulating layer adhering the printed circuit segments and the crystals to the housing. This reduced durometer for the overlaying layer tends to minimize any noise in the signals generated by the crystals at a high impedance.

The system of this invention also includes means such as semi-conductors for converting the signals from the crystals to signals having a low impedance for optimal operation in electrical equipment. The semi-conductors may constitute field effect transistors each having three (3) electrodes and each having conductive and non-conductive states of operation. One of these electrodes may be biased to maintain the transistor in a non-conductive state; a second electrode may be provided with a voltage for supplying energy to the transistor in the conductive state of the transistor; and the third electrode is responsive to the signal on the associated transistor to provide a state of conductivity in the transistor.

Figure 1:
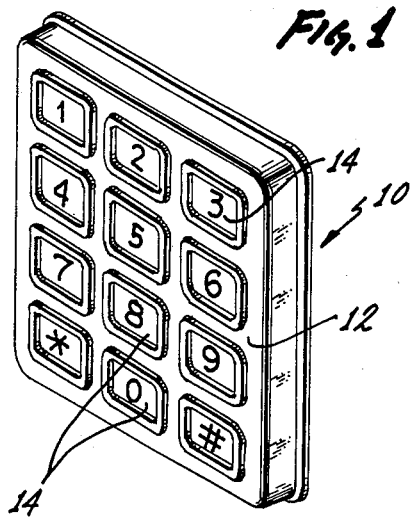
FIG. 1 is a perspective view of a keyboard constituting one embodiment of the invention the keyboard being viewed from a position in front, and to one side, of the keyboard.
Figure 3:
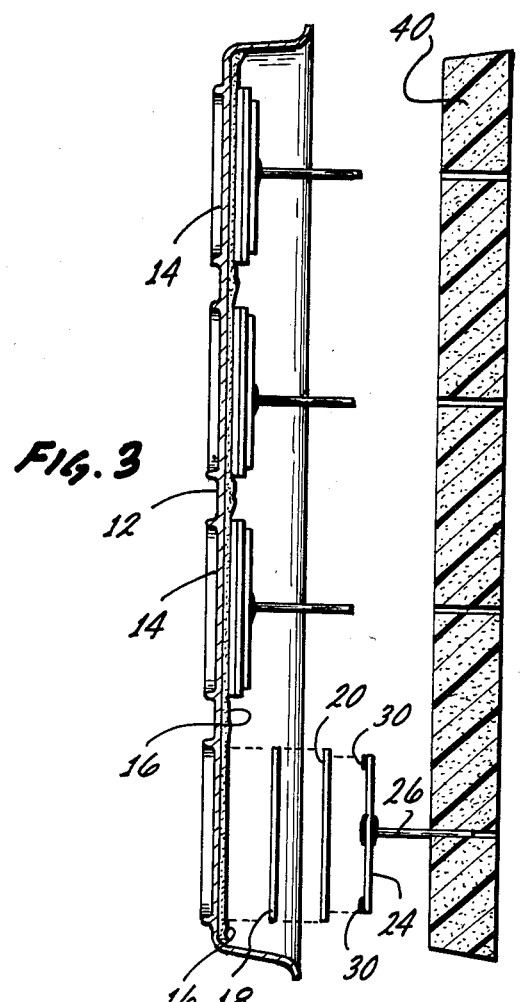
FIG. 3 is an enlarged elevational view, in exploded section, of the keyboard shown in FIGS. 1 and 2.
Figure 2:
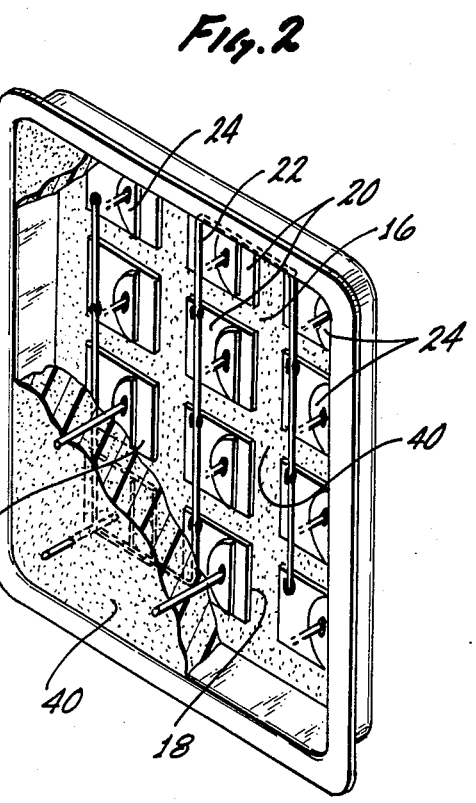
FIG. 2 is a perspective view of the keyboard shown in FIG. 1 as seen from a position to the rear, and to one side, of the keyboard.
Figure 4:
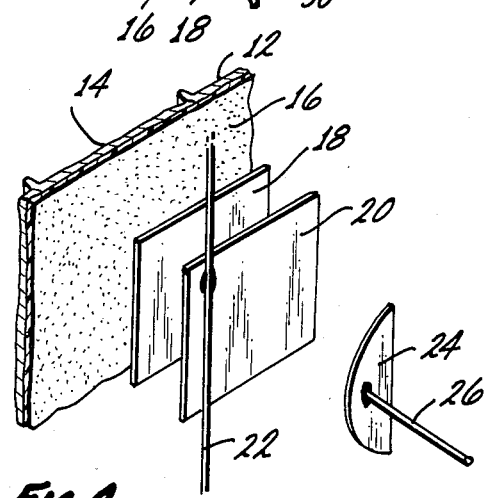
FIG. 4 is an enlarged exploded fragmentary view in perspective of certain elements included in the keyboard shown in the previous Figures.

In one embodiment of the invention, a keyboard generally indicated at 10 is provided. The keyboard includes a housing 12 preferably made from an electrically conductive material such as a stainless steel or anodized aluminum. The housing 12 is preferably made from a sheet material about twenty thousandths inches (0.020") thick but the thickness may be any suitable value such as in the range of ten thousandths inches (0.010″) to one hundred thousandths inches (0.100″).

The housing 12 is provided with different areas 14 which are depressed to identify individual indicia. For example, these aras may represent different numerals or different letters of the alphabet. When the different areas 14 are depressed, forces are created in these areas and these forces are used to generate electrical signals. The individual areas 14 on the housing can be considered to be the keys of the keyboard 10.

A suitable material such as an epoxy 16 is adhered to the housing 12 and is provided with characteristics to transmit the force or stress imposed on the different keyboard aras 14 when these areas are depressed. The epoxy 16 is provided with a relatively high durometer such as a durometer of 96 but may be provided with any suitable durometer such as in a range of 70 to 98. The epoxy is preferably Emerson & Cumming Number 2850 epoxy with a catalyst No. 11 to provide for a fast drying.

Preferably the eopxy 16 is heavily filled and mixed with a ceramic powder made from a suitable material such as aluminum oxide. The ceramic-filled epoxy is provided with characteristics so that it will not produce voids when it is applied to the housing. Voids are undesirable since they inhibit the transmission of the forces applied to the different keyboard areas 14 on the housing 12. The ceramic-filled epoxy 16 is preferably applied to the housing 12 in a thickness in the order of tens of thousandths of an inch.

Sheets 18 of backing material made from a suitable electrically insulating material such as fiberglass are adhered to the epoxy 16 at positions adjacent the keyboard areas 14. The insulating sheets 18 are preferably provided with a suitable thickness such as thirty thousandths inches (0.030″). However, the sheets 18 can have any suitable thickness such as a thickness in the order of fifteen thousandths inches (0.015″) to sixty thousandths inches (0.060″).

A thin sheet 20 of an electrically conductive material is adhered in a conventional manner to each of the insulating sheets 18. For example, the sheets 20 may be made from a suitable material such as copper. The sheets 20 are preferably provided with a suitable thickness such as five thousandths of an inch (0.005″), or even less, but thicknesses as high as sixty thousandths of an inch (0.060″) are satisfactory. The insulating sheets 18 and the conductive sheets 20 may constitute segments of a thin printed circuit board. The sheets 20 are preferably grounded to one another and to the housing 12 by a wire 22 attached as by solder to the sheets 20 and the housing.

Crystals 24 made from a suitable material such as a ceramic are included, each being attached to an individual one of the conductive sheets 20. The crystals 24 are preferably piezoelectric and polarized. The crystals 24 are preferably made from a mixture of lead zirconate and lead titanate in a particular proportion such as approximately fifty-two percent (52%) lead zirconate and approximately forty-eight percent (48%) lead titanate by weight. A suitable material such as niobium oxide or columbium oxide is preferably included in the mixture in a relatively small amount such as approximately eight-tenths of a percent (0.8%) by weight. The niobium oxide or columbium oxide increases the dielectric constant and the piezoelectric constants of the crystals 24. A dash of lanthanum oxide may also be included in the mixture. The crystals may be equivalent to those designated as PZT5, which has a dielectric constant of at least 1700 and a Curie point of approximately 330° C.

The crystals 24 may be provided with a suitable thickness such as approximately ten thousandths of an inch (0.010″). However, the crystals 24 may be provided with a suitable thickness in a range of approximately seven thousandths of an inch (0.007″) to approximately twenty thousandths of an inch (0.020″). Electrical leads 26 may be included, each being attached to the ungrounded surface of an individual one of the crystals 24. The leads 26 may introduce electrical signals from the crystals 24 to associated apparatus shown in FIGS. 5 and 6.

The crystals 24 are adhered to the conductive sheets 20 by a suitable material 28 preferably having electrically conductive properties. For example, a suitable epoxy such as that designated as 60L by Emerson &. Cumming of Canton, Mass., is mixed with a graphite powder to make it conductive and may be applied in a small dab to the central area of each crystal 24. Each crystal 24 may then be adhered to an associated one of the conductive sheets 20. A small amount 30 of the same epoxy as the epoxy 16 may then be applied around the periphery of each of the crystals 24.

An insulating layer 40 overlays the crystals 24 and the conductive sheets 20. The insulating material preferably constitutes an epoxy having a durometer less than about sixty (60). Preferably such an epoxy has relatively flexible characteristics. An epoxy with these characteristics is desirable because it tends to minimize the generation of noise in the signals produced by the crystals 24. For example, an epoxy designated as DC 23 by Thermoset Inc. has been found to be satisfactory.

Other materials than an epoxy have been found to be satisfactory for the layer 40. For example, a polyurethane having a durometer n the range of about fifty (50) to ninety-five (95) may also be used. By way of illustration, a polyurethane designated as 1547 by Products Research Corporation has been found to be satisfactory.

When individual ones of the keyboard areas 14 are depressed, the resultant forces are transmitted through the epoxy 16 to the crystals 24. The crystals then become strained to produce signals on the ungrounded terminals of the crystals. These signals have relatively large amplitudes. For example, the signals may have amplitudes of approximately four (4) or five (5) volts. These signals may then be used to operate the associated apparatus shown in FIGS. 5 and 6.

When an insulating layer 40 such as described above is used, a signal having a relatively high impedance and having a voltage in the order of four (4) to five (5) volts is generated by each crystal 24 when the crystal becomes strained. This voltage from each crystal 24 is introduced to an electrode 42 (FIG. 5) of a control member such as a semi-conductor, generally indicated at 44, associated with the crystal. The semi-conductor 44 is preferably a field effect transistor and the electrode 42 may be the gate electrode of the transistor. A zener diode 46 is connected between the gate electrode 42 and a reference potential such as ground.

A second electrode 48 such as the source of the field effect transistor has a common connection with the reference potential such as ground. A third electrode 52 such as the drain of the field effect transistor receives voltage from a source 54. A resistance 56 may be included in the line between the source 54 and the electrode 52 to limit the current flowing through the semiconductor 44. A diode 58 is connected between the electrodes 42 and 50 with the anode of the diode common with the electrode 42 and the cathode of the diode common with the electrode 50.

Figure 5:
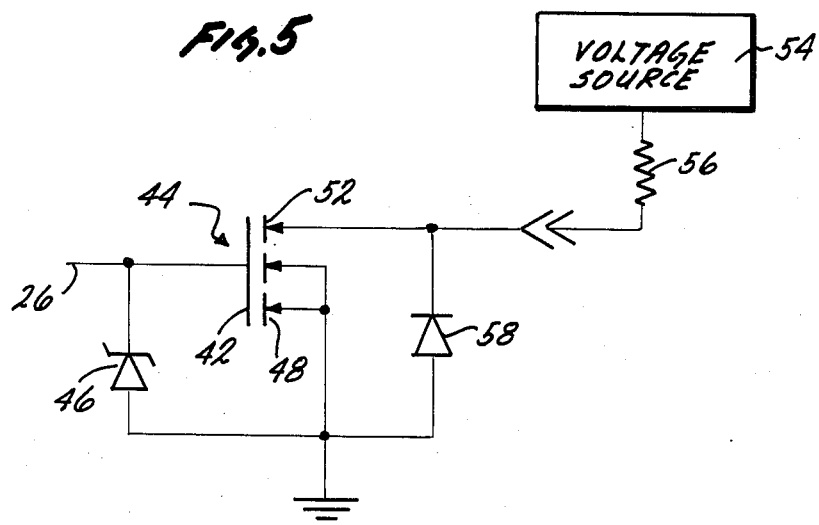
FIG. 5 is a schematic diagram of an electrical system which may be used with the keyboard shown in FIGS. 1 through 4 to produce usable signals at low impedances.

When the crystal 24 becomes strained, it introduces a signal to the gate electrode 42 of the field effect transistor 44, which is normally biased to a state of non-conductivity. This causes the field effect transistor to become conductive when the transistor is an PNP transistor such as shown in Figure 5. The resultant flow of current through a circuit including the voltage source 54, the resistance 56 and the transistor 42 causes the voltage on the drain of the transistor to decrease toward ground. The resultant negative signal on the drain 52 is used to control the operation of output equipment (not shown) such as data processing equipment. The signals produced by the transistors such as the transistor 44 are large in amplitude and are provided with a relatively low impedance so that they can be introduced directly to the output equipment such as the data processing equipment. By way of illustration, the transistor 44 may have an impedance as low as one (1) ohm when it is conductive.

Figure 6:
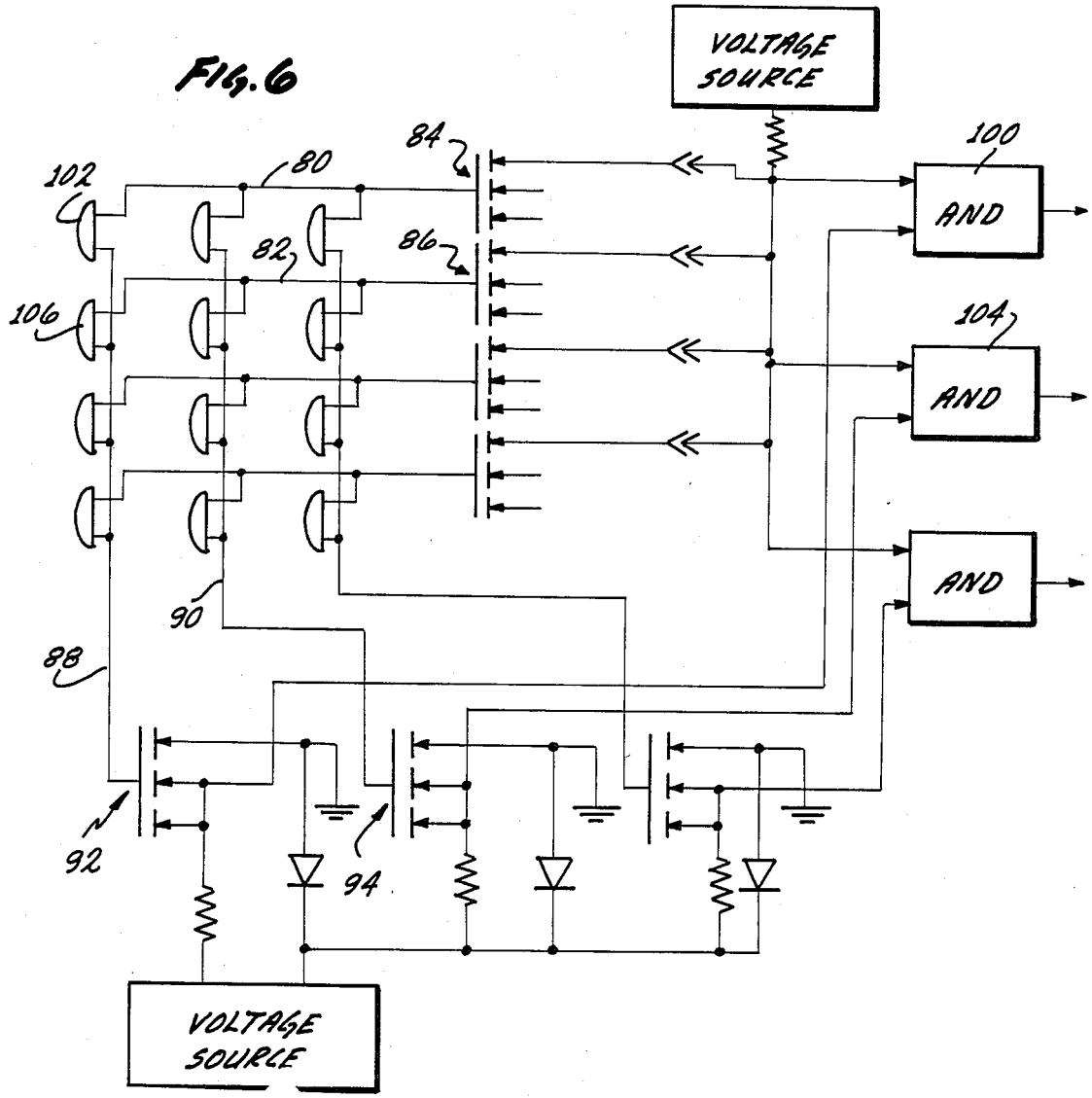
FIG. 6 is a schematic diagram of another electrical system which may be used with the typewriter keyboard shown in FIGS. 1 through 4 to produce usable signals at low impedances.

FIG. 6 illustrates another electrical system for producing electrical signals in accordance with the operation of the keyboard. In the embodiment of the electrical system shown in FIG. 6, rows of the ungrounded terminals of the crystals are connected by a common line. For example, the row of crystals is connected by a line 80 and the next row is connected by a line 82. The line 80 is connected to an NPN field effect transistor, generally indicated at 84, in a manner similar to that shown in FIG. 5. The line 82 is connected to an NPN field effect transistor, generally indicated at 86, in a similar manner.

Each column of the crystals has a common line in FIG. 6 on the ungrounded terminal of the crystals. For example, the first column of the crystals has a common line 88 and the second column of the crystals has a common line 90. The lines 88 and 90 are connected to the crystals at different positions on the crystals than the connections to the lines 80 and 82 so that the lines 80 and 82 will be electrically isolated.

Each line, such as the line 88 and the line 90, is connected to the gate electrode of an individual PNP transistor. For example, the line 88 is connected to the gate of an NPN transistor generally indicated at 92, and the line 90 is connected to the gate electrode of a PNP transistor generally indicated at 94. The drain of each of the transistors such as the transistors 92 and 94 is connected to a reference potential such as ground and an energizing potential is introduced to the source of each such electrode.

The signals on the drain of the transistor 84 and on the source of the transistor 92 are introduced to the input terminals of an "and" gate 100. A signal is accordingly produced on the output terminal of the "and" gate 100 when a crystal 102 common to the top row and the first column in the keyboard is stressed. Similarly, an "and" network 104 has input terminals connected to the drain of the transistor 84 and the source of the transistor 92. As a result, an output signal is produced by the "and" network 104 when a crystal 106 common to the second row and the first column in the keyboard is stresed. Similarly, other "and" networks may be connected to transistors individual to a particular row and a particular column of crystals to produce output signals in accordance with the stressing of an individual one of the keys in the keyboard.

The keyboard described above has certain important advantages. It converts depressions of the keyboard area 14 to the generation of electrical signals by the crystals 24 without any moving parts and without the inclusion of an energy source such as a battery. Furthermore, it provides for the generation of signals of large amplitudes by the crystals 24 by providing for an efficient transmission of forces from the keyboard 12 through the epoxy coating 16 and the epoxy covering 40. These signals are produced with a minimal amount of noise regardless of the amount of noise produced in the signals from the crystals. The keyboard is accordingly sensitive, reliable, small and long-lived.

The invention also includes electrical systems associated with the keyboard. These electrical systems operate to provide electrical signals, in accordance with the stresses imposed upon the crystals, which have a high amplitude and a low impedance. The output equipment (not shown) responsive to the operation of the keyboard is accordingly able to operate efficiently because of the introduction of signals having a relatively high amplitude, low noise and an impedance effectively matching the input impedance of the output equipment.

Although this application has been disclosed and illustrated with reference to particular applications, the principles involved are susceptible to numerous other applications which will be apparent to persons skilled in the art. The invention is, therefore, to be limited only as indicated by the scope of the appended claims.

We claim:
1. In combination,
a housing constructed of a depressible material to define individual areas for depression to identify individual indicia,
a first electrically insulating material adhered to the housing at the individual areas of the housing to transmit strains produced in the housing by the depression of the housing at the individual areas in the housing,
a plurality of thin sheets of an electrically insulating material each attached to the first insulating material at a position corresponding to an individual one of the areas in the housing and depressible to transmit strains,
a plurality of thin sheets of an electrically conductive material each adhered to an individual one of the electrically insulating sheets at one of the individual areas of the housing and depressible to transmit strains,
a plurality of crystals having first and second flat surfaces, each of the crystals being adhered at its first flat surface to an individual one of the electrically conductive sheets at one of the individual areas of the housing and being depressible to produce an electrical signal of the second flat surface of the crystal,
a second insulating material adhered to the second surfaces of the crystals and having properties less hard than the properties of the first insulating material, and
means operatively coupled to the crystals to convert the signals from the crystals to electrical signals having an impedance less than that provided by the crystals.
2. The combination set forth in claim 1, including,
each of the crystals being adhered to the associated one of electrically conductive thin sheets in electri- cally conductive relationship with such electrically conductive thin sheet, and means establishing a common ground to the electrically conductive thin sheets, the housing being made from an electrically conductive material defining a ground and the ground establishing means also establishing a common ground from the thin electrically conductive sheets to the housing.

3. In the combination set forth in claim 2, the second insulating material having properties of minimizing the generation of noise in the crystals, each sub-assembly of a thin sheet of electrically insulating material, a thin sheet of an electrically conductive material and a crystal being disposed with the thin sheet of electrically insulating material being closer to the housing than the thin sheet of electrically conductive material and the thin sheet of electrically conductive material being closer to the housing than the crystal.

4. In the combination set forth in claim 3, the signal converting means including semi-conductors having conductive and non-conductive states, each of the semi-conductors being biased to the non-conductive state and being responsive to the voltage produced in the associated crystal by the depression of the housing at the associated one of the individual areas on the housing to produce a state of conductivity in such semi-conductor.

5. The combination set forth in claim 4, including, means associated with the converting means for providing a source of energy for the converting means in the state of conductivity of the converting means.

6. In combination, a housing made from an electrically conductive material and having a plurality of spaced areas each for identifying an individual symbol, the housing being constructed of a depressible material to be depressed at the individual ones of the spaced areas in the plurality and to become strained in such individual ones of such spaced areas by such depressions, a plurality of crystals each disposed in spaced but adjacent relationship to an individual one of the spaced areas on the housing and having first and second opposite surfaces, the crystals being constructed to be depressed and to produce electrical signals upon such depression, a plurality of means for retaining the crystals in the plurality in spaced but adjacent relationship to the housing for insulating such crystals from the housing and for transmitting to the crystals the strains imposed in the housing by the depression of the housing at the individual ones of the spaced areas in the housing for generation of the signals by the crystals, a plurality of electrically conductive means each disposed between an adjacent one of the retaining means in the plurality and an adjacent one of the crystals in the plurality and electrically connected to the housing for electrically grounding the first surface of the adjacent crystals and adhered to the adjacent one of the retaining means in the plurality and the adjacent one of the crystals in the plurality, the housing, the crystals in the plurality, the retaining means in the plurality and the electrically conductive means in the plurality being constructed and disposed, for each of the crystals in the plurality, at the associated one of the spaced areas in the housing to define successive layers without any voids, and converting means responsive to the signals from the second surfaces of the crystals for producing signals of lower impedance than the impedance of the signals produced in the crystals.

7. The combination set forth in claim 6, including, the converting means including a plurality of semi-conductors each associated with an individual one of the crystals in the plurality and each having conductive and non-conductive states and each biased to the non-conductive state and responsive to the signal from the associated one of the crystals in the plurality for providing an operation of such semi-conductor in the conductive state.

8. The combination set forth in claim 7, including, each of the semi-conductors in the plurality comprising a field-effect transistor, and the converting means including a layer of an insulating maerial overlaying the second surfaces of the crystals in the plurality and having properties of minimizing the production of noise in the crystals.

9. The combination set forth in claim 8, including, each of the retaining means in the plurality including an electrically insulating layer disposed between the housing and an associated one of the electrically conductive means in the plurality and providing for an adherence of such electrically conductive means to the housing, each of the electrically insulating layers in the plurality and the adjacent one of the electrically conductive means in the plurality defining a printed circuit.

10. The combination set forth in claim 6, including, an additional layer of insulating material including an epoxy providing a durometer less than that of the electrically insulating layer in the retaining means, the additional layer of insulating material overlaying the second surfaces of the crystals in the plurality.

11. The combination set forth in claim 6, including, a thin layer of insulating material disposed between the housing and the retaining means in the plurality and adhered to the housing and the retaining means in the plurality, each of the crystals being formed from a thin sheet of material adhered to an individual one of the electrically conductive means in the plurality in electrically conductive relationship with such electrically conductive means.

12. The combination set forth in claim 11, including, epoxy means for adhering each of the electrically conductive means in the plurality to the associated one of the crystals in the plurality, the epoxy means including means for making the epoxy means electrically conductive.

13. In combination, a housing having a plurality of spaced areas each for identifying an individual symbol, the housing being constructed to be depressed at individual ones of the spaced areas to become strained at such spaced areas in accordance with such depressions, a plurality of crystals each formed from a thin sheet of material and each associated with the housing at an individual one of the spaced areas in the housing and each constructed to produce electrical signals in accordance with strains imposed upon the crystals, means defining an electrically grounded plane for one surface of each sheet defining one of the crystals in the plurality, first electrically insulating means disposed between the means defining the electrically grounded plane and the housing at individual ones of the spaced areas in the housing and adhering the means defining the electrically grounded plane to the housing at such individual ones of the spaced areas in the housing and providing for a transmission to associated ones of the crystals of stresses imposed upon the housing at such individual areas of the housing, an electrically insulating material disposed between the housing and the first electrically insulating means and adhered to the housing and the first insulating means and having properties of transmitting to the first insulating mean the stresses imposed upon the housing at the spaced areas of the housing upon the depression of the housing at such spaced areas, means disposed between the means defining the electrically grounded plane and the crystals in the plurality for adhering each of the crystals in the plurality to the means defining the electrically grounded plane in electrically conductive relationship with the means defining the electrically grounded plane, means for providing for the transmittal from the ungrounded terminals of the associated crystals in the plurality of electrical signals in accordance with the depression of the housing at the individual areas of the housing, the housing, the means defining the ground plane, the electrically insulating means and the adhering means being constructed and disposed, for each of the crystals in the plurality, at the associated one of the spaced areas in the housing to define successive layers without any voids, and means responsive to the transmitted signals for producing electrical signals having a lower impedance than the impedance of the signals produced by the crystals.

14. The combination set forth in claim 13, including, the transmittal means including second insulating means less hard than the first insulating means, the second insulating means being adhered to the crystals in the plurality and covering the crystals in the plurality.

15. In combination, a housing having a plurality of spaced areas each for identifying an individual symbol, the housing being constructed to be depressed at individual ones of the spaced areas to become strained at such spaced areas in accordance with such depressions, a plurality of crystals each formed from a thin sheet of material and each associated with the housing at an individual one of the spaced areas in the housing and each constructed to produce electrical signals in accordance with strains imposed upon the crystals, means defining an electrically grounded plane for one surface of each sheet defining one of the crystals in the plurality, first electrically insulating means disposed between the means defining the electrically grounded plane and the housing at individual ones of the spaced areas in the housing and adhering the means defining the electrically grounded plane to the housing at such individual ones of the spaced areas in the housing and providing for a transmission to associated ones of the crystals of stresses imposed upon the housing at such individual areas of the housing, an electrically insulating material disposed between the housing and the first electrically insulating means and adhered to the housing and the first insulating means and having properties of transmitting to the first insulating means the stresses imposed upon the housing at the spaced areas of the housing upon the depression of the housing at such spaced areas, means disposed between the means defining the electrically grounded plane and the crystals in the plurality for adhering each of the crystals in the plurality to the means defining the electrically grounded plane in electrically conductive relationship with the means defining the electrically grounded plane, means for providing for the transmittal from the ungrounded terminals of the associated crystals in the plurality of electrical signals in accordance with the depression of the housing at the individual areas of the housing, the housing, the means defining the ground plane, the electrically insulating means and the adhering means being constructed and disposed, for each of the crystals in the plurality, at the associated one of the spaced areas in the housing to define successive layers without any voids, means responsive to the transmitted signals for producing electrical signals having a lower impedance then the impedance of the signals produced by the crystals, the transmittal means including second insulating means less hard than the first insulating means, the second insulating means being adhered to the crystals in the plurality and covering the crystals in the plurality, and a plurality of insulating means each defining a backing for the electrically grounded plane and each disposed between the electrically insulating means and the electrically grounded plane and each adhered to the electrically insulating means and the electrically grounded plane and each providing an insulation for an individual one of the crystals without any voids and each disposed and constructed to transmit strains from the housing at an individual one of the spaced areas in the housing to an associated one of the crystals in the plurality 16. The combination set forth in claim 14, including, the means providing the signals with a lower impedance than the crystals including a plurality of transistors each having conductive and non-conductive states and each biased to the non-conductive state and each responsive to the signals on the ungrounded surface of the associated crystal to become operative in the conductive state, the housing being electrically conductive and the means defining the electrically grounded plane being connected to the housing.

17. The combination set forth in claim 15, including, the means providing the signals with lower impedance than the crystal including a plurality of field effect transistors each having first, second and third electrodes and each biased on one of the electrodes to a state of non-conductivity and each receiving energy on a first one of the electrodes for operating the transistor in a state of conductivity and each receiving a reference potential on a second one of the electrodes and each receiving the signal from the ungrounded terminal of the associated crystal on a third one of the electrodes.

18. In combination, a housing constructed to define a particular area for depression to identify an individual indicium, a first electrically insulating material having hard properties and adhered to the housing in abutting relationship with the particular area in the housing to transmit strains produced in the housing by the depression of the housing at the particular area in the housing, a thin sheet of an electrically insulating material adhered to the first insulating material at a position corresponding to the particular area in the housing and constructed to transmit strains produced in the housing at the particular area in the housing, a thin sheet of an electrically conductive material adhered to the electrically insulating sheet at a position corresponding to the particular area in the housing and constructed to transmit strains produced in the housing by the depression of the housing at the particular area in the housing, a crystal having a first surface adhered to the electrically conductive sheet in an electrically conductive relationship with the sheet and constructed to be strained and to produce an electrical signal when strained, a second insulating material attached to the crystal and having properties less hard than that of the first insulating material, and means operatively coupled to the crystal to convert the signals from the crystal to electrical signals having an impedance lower than the impedance provided by the signals in the crystal.

19. The combination set forth in claim 18, including, the crystal having a first surface adhered to the electrically conductive thin sheet in electrically conductive relationship with the electrically conductive thin sheet, the crystal having a second surface opposite to the first surface, and the converting means being operatively coupled to the second surface of the crystal.

20. In the combination set forth in claim 19, the second insulating material having properties of minimizing the generation of noise in the crystal, the sub-assembly of the thin sheet of electrically insulating material, the thin sheet of electrically conductive material and the crystal being disposed with the thin sheet of electrically insulating material being closer to the housing than the thin sheet of electrically conductive material and the thin sheet of electrically conductive material being closer to the housing than the crystal.

21. In the combination set forth in claim 20, the converting means including a semi-conductor having conductive and non-conductive states and biased to the non-conductive state and responsive to the voltage produced in the crystal by the depression of the particular area on the keyboard to produce a state of conductivity in the semiconductor.

22. The combination set forth in claim 21, including, means associated with the converting means for providing a source of energy for the converting means in the state of conductivity of the converting means, the housing being electrically conductive, and the thin sheet of electrically conductive material being attached to the housing.

23. In combination, a housing having a particular area depressible to produce strains in the housing to identify an individual symbol.

a crystal disposed in spaced but adjacent relationship to the particular area on the housing to become strained upon the depression of the particular area in the housing to produce an electrical signal in accordance with such strain, electrically conductive means disposed between the crystal and the housing and defining a ground plane, means for retaining the crystal and the electrically conductive means in spaced but adjacent relationship to the housing at the particular area in the housing and the crystal and for insulating the crystal from the housing and for transmitting to the crystal any strains imposed in the housing by the depression of the housing at the particular area in the housing for the generation of signals by the crystal, the retaining means including an electrically insulating material adhered to the housing at the particular area in the housing and having properties of transmitting to the electrically conductive means and the crystal the stresses imposed upon the housing at the particular area by the depression of the housing at the particular area, and converting means responsive to the signals from the crystal for producing signals of lower impendace than those produced by the crystal.

24. The combination set forth in claim 23, including, the converting means including a semi-conductor associated with the crystal and having conductive and non-conductive states and biased to the non-conductive state and responsive to the signal from the crystal for providing an operation of the semiconductor in the conductive state.

25. The combination set forth in claim 24, including, the semi-conductor comprising a field-effect transistor, and the converting means including a layer of an insulating material overlaying the crystal and having properties of minimizing the production of noise in the crystal.

26. The combination set forth in claim 25, including, the retaining means further including electrically insulating means disposed between the electrically insulating material and the electrically conductive means at the particular area of the housing and adhered to the electrically insulating material and the electrically conductive means and defining a printed circuit board with the electrically conductive means, the electrically insulating layer having a higher durometer than the overlaying layer of insulating material.

27. The combination set forth in claim 26, including, the housing being electrically conductive, the electrically conductive means comprising a sheet of electrically conductive material, means for adhering the crystal to the electrically conductive sheet and for providing for an electrically conductive relationship between the electrically conductive sheet and the abutting surface of the crystal, and means for grounding the electrically conductive sheet to the housing.

28. The combination set forth in claim 23, including, the electrically conductive means comprising a thin sheet of electrically conductive material, a printed circuit member including a thin backing sheet of an electrically insulating material and the thin electrically conductive sheet adhered to the backing sheet, the printed circuit member being adhered to the electrically insulating material and to the crystal, the crystal being formed from a thin sheet of a piezoelectric material having one surface adhered to the electrically conductive sheet in electrically conductive relationship with the sheet.

29. The combination set forth in claim 24, including, the housing being made from an electrically conductive material, and the electrically conductive means constituting an electrically conductive sheet electrically grounded to the housing and the ungrounded surface of the crystal being connected to the semi-conductor.

30. In combination, an electrically conductive housing having a particular area depressible to produce strains in the housing to identify an individual symbol, a crystal formed from a thin sheet defined by first and second opposite surfaces and constructed to be strained to produce electrical signals, means operatively coupled to the first surface of the crystal and electrically connected to the housing to define an electrically grounded plane for the first surface of the crystal and constructed to transmit to the crystal the stresses imposed upon the housing at the particular area of the housing, a first electrically insulating material adhered to the housing at the particular area in the housing without voids and providing for a transmission to the crystal of stresses imposed upon the housing at the particular area of the housing by the depression of the housing in the particular area, a backing sheet made from an electrically insulating material and disposed between the first insulating material and the means defining the ground plane in adhered relationship to the first insulating means and the means defining the ground palne, means for providing for the transmittal of electrical signals from the ungrounded terminal of the crystal, and means responsive to the transmitted signals for producing electrical signals having a lower impedance than the impedance of the signals produced in the crystal.

31. The combination set forth in claim 30, including, the means defining the ground plane constituting an electrically conductive sheet and the backing sheet and the electrically conductive sheet constituting a printed circuit.

32. In combination, an electrically conductive housing having a particular area depressible to produce strains in the housing to identify an individual symbol, a crystal formed from a thin sheet defined by first and second opposite surfaces and constructed to be strained to prdouce electrical signals, means operatively coupled to the first surface of the crystal and electrically connected to the housing to define an electrically grounded plane for the first surface of the crystal and constructed to transmit to the crystal the stresses imposed upon the housing at the particular area of the housing, first electrically insulating means disposed between the means defining the ground plane and the particular area in the housing and providing for the adherence of the means defining the ground plane to the particular area in the housing without voids and providing for a transmission to the crystal of stresses imposed upon the housing at the particular area of the housing by the depression of the housing in the particular area, a backing sheet made from an electrically insulating material and disposed between the first insulating means and the means defining the ground plane in adhered relationship to the first insulating means and the means defining the ground plane, means for providing for the transmittal of electrical signals from the ungrounded terminal of the crystal, means responsive to the transmitted signals for producing electrical signals having a low impedance than the impedance of the signals produced in the crystal, the means defining the ground plane constituting an electrically conductive sheet and the backing sheet and the electrically conductive sheet constituting a printed circuit, and the transmittal means including an electrically insulating layer adhered to the ungrounded terminal of the crystal and having properties less hard than the properties of the first insulating material.

33. The combination set forth in claim 31, including, the means providing the signals with low impedance including a transistor having conductive and non-conductive states and biased to the non-conductive state and responsive to the signals on the ungrounded surface of the crystal to become operative in the conductive state.

34. The combination set forth in claim 32, including, the means providing the signals with low impedance including a field effect transistor having first, second and third electrodes and biased on one of the electrodes to a state of non-conductivity and receiving energy on a first one of the electrodes for operating the transistor in a state of conductivity and receiving a reference potential on a second one of the electrodes and receiving the signal from the ungrounded terminal of the crystal on a third one of the electrodes.

* * * * *